(12) United States Patent
Usoskin

(10) Patent No.: US 9,065,267 B2
(45) Date of Patent: Jun. 23, 2015

(54) SUPERCONDUCTIVE DEVICE WITH BRIDGE CONTACTS

(71) Applicant: Bruker HTS GmbH, Hanau (DE)

(72) Inventor: Alexander Usoskin, Hanau (DE)

(73) Assignee: Bruker HTS GmbH, Hanau (DE)

( * ) Notice: Subject to any disclaimer, the term of this patent is extended or adjusted under 35 U.S.C. 154(b) by 112 days.

(21) Appl. No.: 13/902,999

(22) Filed: May 28, 2013

(65) Prior Publication Data

US 2014/0357496 A1  Dec. 4, 2014

(30) Foreign Application Priority Data

Jun. 6, 2012  (EP) ..................................... 12171058

(51) Int. Cl.
*H01L 39/16* (2006.01)
*H02H 7/00* (2006.01)
*H02H 9/02* (2006.01)

(52) U.S. Cl.
CPC ............... *H02H 7/001* (2013.01); *H02H 9/023* (2013.01); *H01L 39/16* (2013.01)

(58) Field of Classification Search
CPC ................................. H01L 39/16; H02H 9/023
USPC .............................................. 335/216; 361/19
See application file for complete search history.

(56) References Cited

U.S. PATENT DOCUMENTS

| 4,700,257 A | 10/1987 | Bekhaled |
| 8,150,486 B2 * | 4/2012 | Usoskin ........................ 505/220 |
| 2007/0179063 A1 | 8/2007 | Malozemoff et al. |

FOREIGN PATENT DOCUMENTS

| EP | 2 117 056 | 11/2009 |
| WO | WO 03/107447 | 12/2003 |

* cited by examiner

*Primary Examiner* — Ramon Barrera
(74) *Attorney, Agent, or Firm* — Paul Vincent

(57) ABSTRACT

A superconducting device (1) has an elongated coated conductor (2), with a substrate (3) and a quenchable superconducting film (4), wherein the elongated coated conductor (2) has a width W, and an external shunt system (5), with bridge contacts (6; 6a, 6b), electrically connected to the superconducting film (4), and a resistive member (7), thermally insulated from the coated conductor (2) and electrically connected to the bridge contacts (6; 6a, 6b). The device is is characterized in that the bridge contacts (6; 6a, 6b) along the elongated coated conductor (2) have a spacing SP with SP≤8*W. The device reduces the risk of a burnout of a superconducting device in case of a quench in its superconducting film.

18 Claims, 4 Drawing Sheets

SUPERCONDUCTIVE DEVICE WITH BRIDGE CONTACTS

This application claims Paris convention priority of EP 12 171 058.6 filed Jun. 6, 2012 the entire disclosure of which is hereby incorporated by reference

BACKGROUND OF THE INVENTION

The invention relates to a superconducting device, comprising
a) an elongated coated conductor, with a substrate and a quenchable superconducting film, wherein the elongated coated conductor has a width W,
b) and an external shunt system, with
bridge contacts, electrically connected to the superconducting film, and
a resistive member, thermally insulated from the coated conductor and electrically connected to the bridge contacts.

Such a superconducting device is known from EP 2 117 056 B1.

Superconducting devices are used in different ways, in particular to transport electric currents, for current conditioning such as in fault current limiters, or for generating high strength magnetic fields.

Superconducting devices comprise a conductor which may, at a temperature below the so called critical temperature Tc, carry an electric current at practically no ohmic losses. In order to achieve said low temperature, the conductor is typically cooled with liquefied gases such as liquid helium. Further, to have a superconducting state, it is also necessary to stay below a critical current density and below a critical magnetic field with the conductor.

When using high temperature superconductor (HTS) materials, e.g. of YBCO material, higher temperatures, current densities and magnetic fields become accessible. HTS material is typically used as a film (or coating) on a normally-conducting or insulating substrate.

A difficulty when employing superconducting devices is the risk of a sudden loss of the superconducting state, also called a quench. If a region of a superconducting film quenches, a high electric current has to pass through the region now normally conducting, what causes a considerable heating of said region. This heating may damage the superconducting material, what is also called a burnout.

Generally, it is desired that a superconducting device can survive a quench, so it can be used again e.g. after recooling of the device. In order to avoid a burnout of the superconducting material, it is known to protect superconducting films with shunt resistance.

EP 2 117 056 B1 discloses an elongated coated conductor, comprising a superconducting film on a substrate, covered by a first metallic member, and electrically connected to a resistive member running in parallel to the elongated conductor via regularly spaced bridge contacts. The resistive member is spaced apart from the elongated conductor, so the resistive member is thermally decoupled from the elongated coated conductor.

In case of a quench in the superconducting film, the major part of the electric current is rerouted around the quenched region through the resistive member, so the current strength through the elongated conductor in the quenched region is reduced. The major heating occurs in the resistive member then, and not in the elongated conductor.

However, even when using such an external shunt system, a burnout of the superconductor film may still occur.

It is the object of the invention to further reduce the risk of a burnout of a superconducting device in case of a quench in its superconducting film.

SUMMARY OF THE INVENTION

This object is achieved, in accordance with the invention, by a superconducting device as mentioned in the beginning, characterized in that the bridge contacts along the elongated coated conductor have a spacing SP with $SP \leq 8*W$.

The inventors have found that surprisingly, when the spacing SP of the bridge contacts (bridge elements) is chosen sufficiently small as compared to the width W of the elongated conductor, namely up to about eight times the width W, the risk of a burnout of the superconducting film in case of its quench is significantly reduced. Accordingly, a superconducting device comprising an external shunt system with a corresponding spacing of the bridge contacts is more likely to survive a quench event, so expensive replacements after a quench may be avoided.

The bridge contacts are preferably soldered to the coated conductor onto the side of the superconducting film, extending across the full width of the coated conductor. Typically, the bridge contacts are oriented perpendicular to the direction in with the elongated coated conductor extends, and have a (preferably uniform) breadth $B \leq \frac{1}{3}*W$, preferably $B \leq \frac{1}{5}*W$. The spacing of the bridge contacts is measured between neighbouring bridge contacts from and to the edges facing each other. The resistive member typically extends parallel to the coated conductor.

The bridge contacts typically comprise copper strips, with a silver solder providing contact to the coated conductor. The resistive member is typically made of iron and spaced apart from the coated conductor, in order to have a good thermal insulation from the coated conductor. If desired, a cooled shield (e.g. of sheet metal) may be arranged in the space between the coated conductor and the resistive member, in order to avoid transfer of thermal radiation.

In a preferred embodiment of the inventive superconducting device, the superconducting device is designed such that in case of a quench in the superconducting film, a corresponding normally conducting zone is confined between two neighbouring bridge contacts. The normally conducting zone is also referred to as "hot spot". By confining the normally conducting zone, catastrophic burnouts of the coated conductor are even less likely. In particular, the overall heat dissipation occurring in the initial phase of a quench can be limited. The confinement can typically be achieved by a suitable choice of the internal shunting resistance (see below). However, if need may be, in order to facilitate a confinement of the normally conducting zone, the bridge contacts may be purposefully cooled, e.g. by projecting into a cooling liquid such as LN2 or LHe, typically by means of a cooling extension; further, the bridge contacts should extend over the full width of the coated conductor.

Preferred is also an embodiment wherein the coated conductor has an engineering resistivity $\rho_{eng}$ shunting the coated conductor in a quenched state, with $\rho_{eng} > 2.5 \, \Omega$,
wherein $R_{IntShunt} = \rho_{eng}*L/W$, with $R_{IntShunt}$: internal shunt resistance of the coated conductor at its mean operation temperature in the quenched state, L: length of the coated conductor, W: width of the coated conductor.

When this criterion is fulfilled, the confinement of a hot spot between two neighbouring bridge contacts can be achieved with a surprisingly good reliability, according to the findings of the inventors. An even higher reliability can be achieved when choosing $\rho_{eng} > 5.0 \Omega$. The internal shunt resistance is the (ohmic) resistance of the coated conductor in the quenched state, available to the electric current that would flow through the superconducting film in the superconducting state, excluding the external shunt system. The current paths providing the internal shunt resistance are thermally coupled to the coated conductor (such as the substrate or cap layers on the superconducting film). The engineering (internal shunt) resistivity $\rho_{eng}$ according to this criterion is comparably high, typically available only with a dielectric substrate, or with a metallic substrate electrically insulated from the superconducting film, or with a rather thin metallic substrate.

In an advantageous embodiment of the inventive superconducting device, SP≤1*W, in particular 0.3*W≤SP≤1*W. In this case, there is practically no intrinsic shunt protection necessary in order to avoid a burnout. Further, shorter response and recovery times are achievable.

In an alternative, also advantageous embodiment, 1.5*W≤SP≤8*W, in particular 3*W≤SP≤8*W. In this case, a relatively low fraction of the coated conductor is covered with material of the bridge contacts, so higher voltages can be dropped across the coated conductor in the quenched state.

Further preferred is an embodiment wherein between each two neighbouring bridge contacts, $40*R_{ExtShunt} \leq R_{IntShunt} \leq 500*R_{ExtShunt}$, in particular $50*R_{ExtShunt} \leq R_{IntShunt} \leq 200*R_{ExtShunt}$, with $R_{ExtShunt}$: external shunt resistance provided by the external shunt system at its mean operation temperature in the quenched state. In this case, the major fraction of heat is dissipated in the resistive member, and not in the coated conductor.

Preferred is also an embodiment wherein the superconducting film of the coated conductor comprises YBCO material. This material has shown good results in practice, in particular with confining a hot spot between two bridge contacts and low burnout probability.

Particularly advantageous is an embodiment wherein the substrate is an electrically conducting substrate, in particular a steel substrate, electrically insulated from the superconducting film by means of a dielectric layer, and that the substrate is equipped with electrical contacts for providing a heating current to the substrate. By heating the substrate (possibly limited to one or more quenched regions), oscillations between normally conducting state and superconducting state can be suppressed.

Also preferred is an embodiment wherein the bridge contacts extend over the full width W of the coated conductor.

Further within the scope of the present invention is a superconducting device, comprising
a) a quenchable coated conductor, with a substrate and a superconducting film, wherein the quenchable coated conductor exhibits at least one hot spot forming after a quench event,
b) and an external shunt system, with
bridge contacts, electrically connected to the superconducting film, and
a resistive member, thermally insulated from the coated conductor and electrically connected to the bridge contacts,
characterized in that the bridge contacts along the quenchable coated conductor have a spacing SP which corresponds to a characteristic longitudinal width of the hot spot formed at a minimal level of power dissipation during the quench event. This reduces the risk of a burnout of a superconducting device in case of a quench in its superconducting film. A "hot spot" here means a normally conducting area of the surface of coated conductor. The hot spot forms as a result of local quench. The hot spot should cross the width of the coated conductor (otherwise power dissipation via metallic conductivity is not available).

In a preferred embodiment of this superconducting device, the superconducting device has a design in accordance with the inventive superconducting device described above.

Also within the scope of the present invention is a fault current limiter, comprising an inventive superconducting device as described above. In a fault current limiter, quenching is part of the regular limiting function, so a low burnout probability as achieved by means of the present invention is particularly valuable.

In a preferred embodiment of the inventive fault current limiter, the fault current limiter is of AC type with a primary coil for carrying a current to be limited and a secondary coil coupled to the primary coil via a common magnetic flux, and the secondary coil is integrated in the superconducting device. A quench of the secondary coil, what occurs in case of a fault current in the primary coil, will not damage the secondary coil, so the inventive fault current limiter can be reused after a limiting operation. A good coupling via a common magnetic flux may be established by a common ferromagnetic (e.g. iron) core of the coils.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

BRIEF DESCRIPTION OF THE DRAWING

FIG. 1b shows the inventive superconducting device of FIG. 1a in a cross-sectional view along plane Ib-Ib of FIG. 1a;

FIG. 3b a schematic, cross-sectional view in a horizontal plane of the fault current limiter of FIG. 3a, along plane IIIb of FIG. 3a;

DESCRIPTION OF THE PREFERRED EMBODIMENT

Figure 1A:
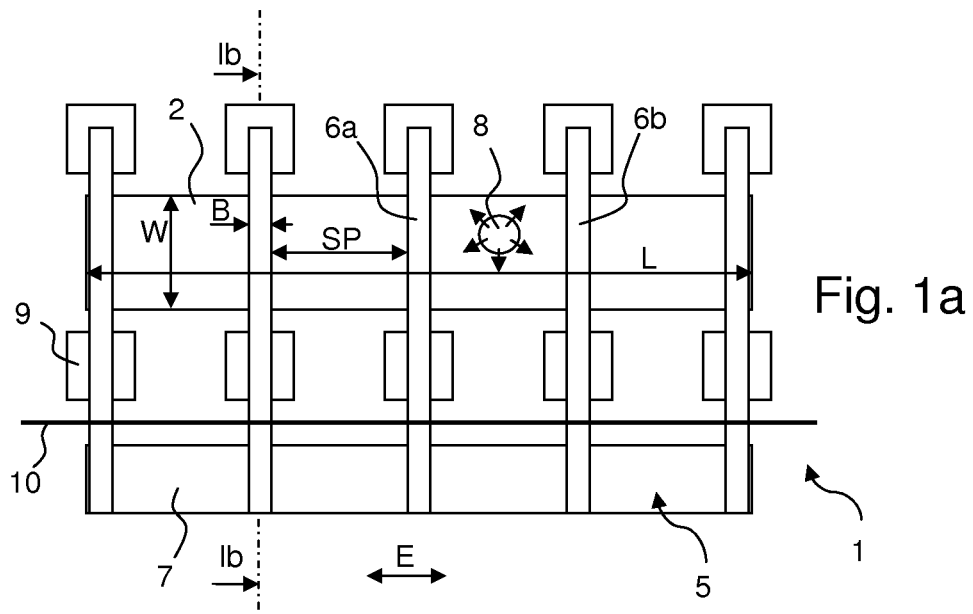
FIG. 1a shows schematically an embodiment of an inventive superconducting device, in a top view.
Figure 1B:
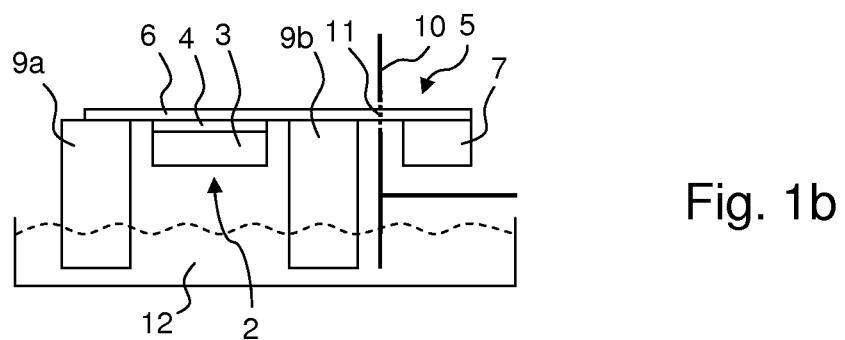

By way of example, an embodiment on an inventive superconducting device 1 is shown in FIG. 1a and FIG. 1b in top view and cross-sectional side view.

The superconducting device 1 comprises an elongated coated conductor 2, comprising a substrate 3 (here a dielectric substrate) and a quenchable superconducting film 4 (here an YBCO film) deposited on top of the substrate 3. The coated conductor 2 carries, during a normal, non-quenched state of the superconducting film 4, an electric current flowing in the elongated direction E, i.e. from left to right (or vice versa) in FIG. 1*a*.

The coated conductor 2 is protected against burnout in case of a quench by means of an external shunt system 5, comprising a plurality of bridge contacts (bridge elements) 6 and a resistive member 7, both made of metal. The bridge contacts 6 (here made of copper) are connected to the coated conductor 2 at the (in FIG. 1*b* upper) film side. The bridge contacts 6 extend over the complete width W of the coated conductor 6, and run perpendicular to the elongated direction E. The bridge contacts 6 themselves have a breadth B in the elongated direction E, and have a regular spacing SP in E direction between the edges of neighboring bridge contacts 6 facing each other. The bridge contacts 6, in turn, are connected to the resistive member 7, which runs electrically (and here also geometrically) in parallel to the coated conductor 2.

In case of a quench, wherein a hot spot (normally conducting zone) 8 occurs and grows within the superconducting film 4 of the coated conductor 2, the electric current formerly running through the hot spot area may be rerouted through the two bridge contacts 6*a*, 6*b* between which the hot spot 8 has occurred and through the resistive member 7 between said bridge contacts 6*a*, 6*b*. Then the current through the superconducting film 4 between the two bridge contacts 6*a*, 6*b* can be reduced, what in turn reduces the heat generated in the superconducting film 4 or the coated conductor 2, respectively.

In the embodiment shown, the bridge contacts 6, 6*a*, 6*b* are connected via extensions 9, 9*a*, 9*b* to a reservoir 12 of liquid helium (or another cooling liquid or means), and thus are efficiently cooled. If for example at hot spot 8 some heat is generated and spreads, this heat may be compensated by the cooling at the bridge contacts 6*a*, 6*b* so that the hot spot 8 is confined between the two bridge contacts 6*a*, 6*b* (i.e. the hot spot 8 may not spread across the bridge contacts 6*a*, 6*b*); even a reestablishing of the superconducting state may be achieved quickly.

When electric current has been rerouted through the resistive member 7, heat is generated there (note that the heating power depends on the ohmic resistance within the resistive member 7). The resistive member 7 is thermally insulated from the coated conductor 2 here by a spatial separation, cooling the bridge contacts 6 via the extensions 9 (in particular the extension 9*b* located between the coated conductor 2 and the resistive member 7, as shown in FIG. 1*b*), and by a thermal shield 10, typically made of sheet metal, extending laminary in the space between the coated conductor 2 and the resistive member 7, and cooled by the reservoir 12. The shield 10 blocks thermal radiation originating from the resistive member 7, in particular when it conducts an electric bypass current (which may lead to a red heat glowing of the resistive member 7). The shield has openings 11 for the bridge contacts 6.

In accordance with the invention, the resistance $R_{IntShunt}$ of the coated conductor 2 in the quenched state between two neighboring bridge contacts 6*a*, 6*b*, and the resistance $R_{ExtShunt}$ of the resistive member 7 between (and including) the two neighboring bridge contacts 6*a*, 6*b* here have a ratio of about $R_{IntShunt}/R_{ExtShunt}=100$. Accordingly, the major part (about 99%) of the electric current through the superconducting device 1 will be rerouted though the resistive member 7.

Note that $R_{IntShunt}$ and $R_{ExtShunt}$ may also be determined over the full length L of the (completely quenched) coated conductor 2.

The coated conductor 2, in particular the substrate 4 and possible cap layers, buffer layers, and the superconducting film 4 with respect to material properties and thicknesses (in FIG. 1*b* in vertical direction), is designed such that its engineering resistivity $\rho_{eng}$ is larger than 2.5 Ohm, with $\rho_{eng}=R_{IntShunt}*W/L$; here $R_{IntShunt}$ is related to the full length L. $R_{IntShunt}$ may be measured between the two ends of the coated conductor 2, without the external shunt system 5 (e.g. when the resistive member 7 and the bridge contacts 6 are not yet installed or removed again). $R_{ExtShunt}$ may be measured between the outermost two bridge contacts 6, without the coated conductor 2 (e.g. when the coated conductor 2 is not yet installed or removed again).

In the example shown, the ratio of the spacing SP to width W is about 1.2. When applying such a ratio, in accordance with the invention, the coated conductor 2 can do without a significant internal shunt protection, i.e. $R_{IntShunt}$ may be infinite (or, in practice, much larger than $R_{ExtShunt}$, such as by a factor of more than 1000).

Figure 1C:
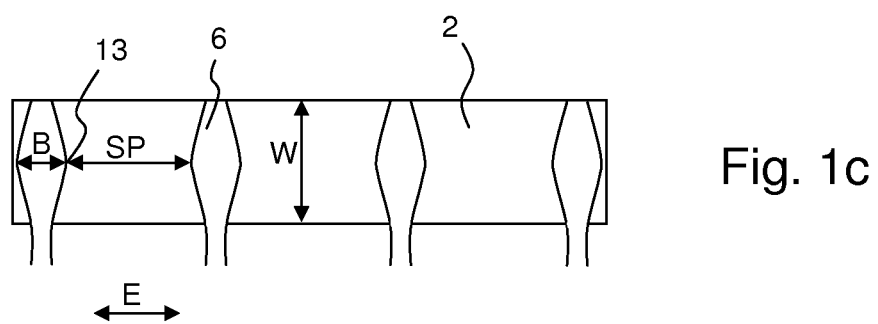
FIG. 1c shows schematically a top view of a coated conductor connected to round-bodied bridge contacts, for use in an inventive superconducting device.

Note that in case of arbitrarily formed bridge contacts 6, compare the rounded bridge contacts 6 in FIG. 1*c*, the spacing SP is measured between two neighboring bridge contacts 6 at those parts 13 of the opposing edges (on the coated conductor 2) protruding the most towards the other edge, in parallel to the extension direction E. The breadth B of a bridge contact 6 is measured as the largest dimension in parallel to the extension direction E.

Figure 2A:
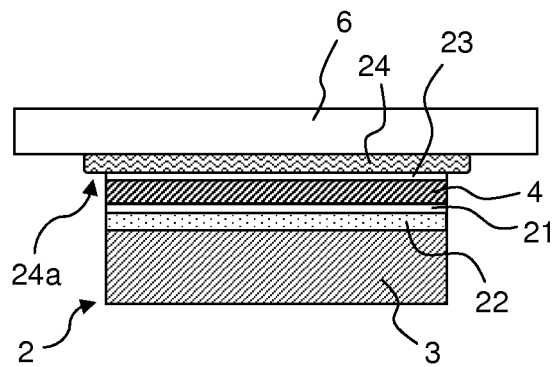
FIG. 2a a cross-sectional view of a coated conductor, connected to a bridge contact, with an electrically insulating layer; for use in an inventive superconducting device.

FIG. 2*a* shows a coated conductor 2 connected with a bridge contact 6, in accordance with the invention, which may be used in the superconducting device of FIG. 1*a*, for example.

The coated conductor 2 comprises a substrate 3, here made of steel, and a superconducting film 4. In order to keep the internal shunt resistance $R_{IntShunt}$ high, the electrically conducting steel substrate 3 is insulated from the superconducting film 4 by a dielectric (insulating) layer 22, e.g. made of $Al_2O_3$, so the substrate 3 cannot contribute significantly to the internal shunt resistance $R_{IntShunt}$.

The superconducting film 4 has been grown on a buffer layer 21 in order to achieve an epitaxial film growth. The superconducting film 4 is protected against oxidation and corrosion by means of a capping layer 23, typically made of a noble metal such as gold.

The electrical contact to the bridge contact 6 is provided by a solder 24, preferably a silver solder. Note that the solder 24 is only used below the bridge contact 6 and maybe a small bulge 24*a* around. The bridge contact 6 extends here to both sides of the coated conductor 2 (compare FIG. 1*a*).

In the example of FIG. 2*a*, the internal shunt resistance $R_{IntShunt}$ of the coated conductor 2 between two neighboring bridge contacts 6 is determined by the (quenched) resistance of the superconducting film 4, the capping layer 23 and maybe the buffer layer 21 (in case the buffer layer 21 has a significant conductivity).

Figure 2B:
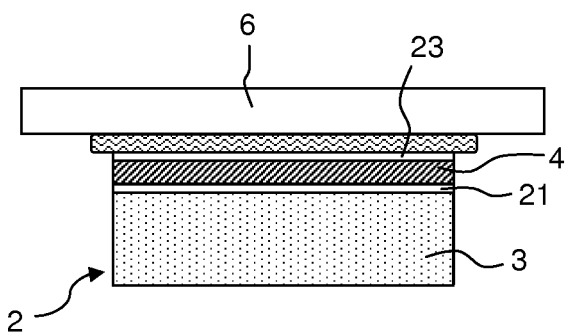
FIG. 2b a cross-sectional view of a coated conductor, connected to a bridge contact, with an insulating substrate; for use in an inventive superconducting device.

In FIG. 2*b*, another type of coated conductor 2 connected to a bridge contact 6 is illustrated; only the differences with respect to FIG. 2*a* are discussed in detail.

Here the substrate 3 is of dielectric (insulating) type. The buffer layer 21 is directly deposited on the substrate 3. Again, only the (quenched) superconducting film 4 and the capping layer 23 and maybe the buffer layer 21 contribute to $R_{IntShunt}$.

Figure 2C:
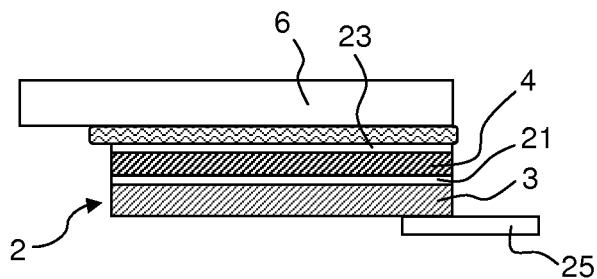
FIG. 2c a cross-sectional view of a coated conductor, connected to a bridge contact, with a thin metallic substrate; for use in an inventive superconducting device.

In FIG. 2*c*, yet another type of coated conductor 2 is illustrated; again, only the differences with respect to FIG. 2*a* are discussed in detail.

Here the substrate 3 is of steel and therefore electrically conductive; however, it is rather thin, such 40 μm or less. The internal shunt resistance $R_{IntShunt}$ is determined by the substrate 3, the buffer layer 21, the (quenched) superconducting film 4 and the capping layer 23. Since the substrate 3 is rather thin, $R_{IntShunt}$ is only slightly reduced by the relatively high electrical conductivity of the metallic substrate material.

In the example of FIG. 2c, the bridge contact 6 extends only on one side of the coated conductor 2 (compare FIG. 1c). Further, an electrical contact 25 for heating the substrate 3 is shown. The electrical contact 25 is attached on the non-film (here bottom) side of the substrate 3; similar contacts are typically periodically attached to the substrate 3, e.g. where also bridge contacts 6 are connected. Then parts of the coated conductor 2 may be purposefully electrically heated.

Figure 3A:
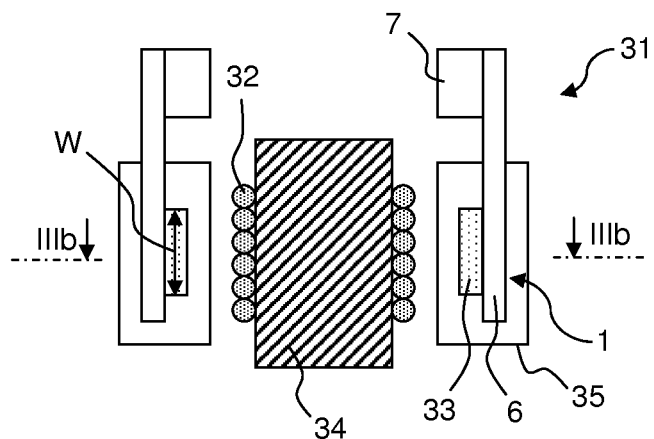
FIG. 3a a schematic cross-sectional view in a vertical plane of an embodiment of an inventive AC fault current limiter.
Figure 3B:
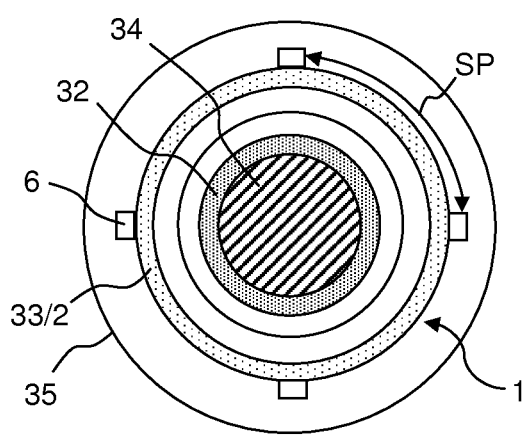

FIG. 3a and FIG. 3b show an embodiment of an inventive alternating current (=AC) type fault current limiter 31, comprising an inventive superconducting device 1, in a vertical and a horizontal cross-sectional view.

The fault current limiter 31 comprises a normally conducting primary coil 32 and a coaxially arranged secondary coil 33, which is part of the superconducting device 1. The secondary coil 33 is realized as the coated conductor 2 of the superconductive device 1, which is arranged in a closed, ring-shaped fashion (note that jointing is not shown, for simplification). Inside the primary coil 32, a ferromagnetic core 34 is positioned, providing a good coupling of the primary and secondary coil 32, 33. During normal operation, the primary coil 32 carries an electric current to be limited against fault current, and in the secondary coil 33, a superconducting current is induced which counter-balances the magnetic field of the primary coil 32, so the primary coil 32 experiences no significant inductive resistance.

The secondary coil 33 is located within a cryostat 35, inside of which a cryogenic temperature (such as at or below 90K, preferably at or below 4.2K) has been established, so the coated conductor 2 (or its superconducting film, respectively) can assume the superconducting state.

In case of a rise of the current in the primary coil 32 ("fault current"), the current in the secondary coil 33 also rises, namely above the critical current Ic of the secondary coil 33, and the superconductivity collapses in the secondary coil 33 ("quench"). As a consequence, the primary coil 32 now experiences an inductive resistance, what limits the current in the primary coil 32.

In order to be able to bear the quench, the secondary coil 33 or the coated conductor 2, respectively, is contacted with (here) four bridge contacts 6, which lead out of the cryostat 35. The bridge contacts 6, in turn, are connected to a ring-shaped resistive member 7 outside the cryostat 35. Thus the resistive member 7 is thermally decoupled from the coated conductor 2.

In the example shown, the spacing SP of the bridge contacts 6, measured along the bent, elongated coated conductor 2, and the width W of the coated conductor 2 have a ratio SP/W of about 3.0 here, in accordance with the invention. The coated conductor 2 has a reduced risk of burnout in case of a quench.

Figure 3C:
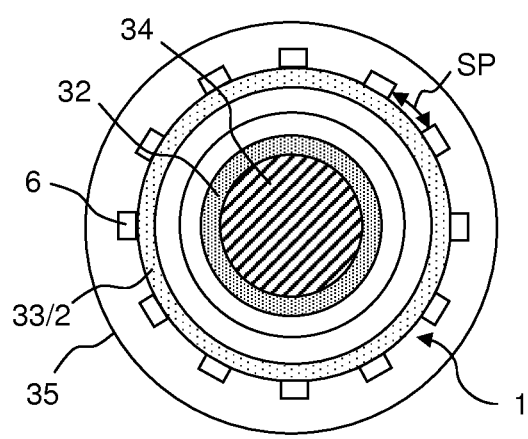
FIG. 3c a schematic, cross-sectional view of another embodiment of an inventive fault current limiter similar to the one shown in FIG. 3b, with twelve bridge contacts.

FIG. 3c shows another embodiment of an inventive alternating current (=AC) type fault current limiter 31 in a horizontal cross-sectional view similar to the one shown in FIG. 3a and FIG. 3b, but with twelve bridge contacts 6 instead of four. Here, the ratio SP/W is about 0.6 in accordance with the invention.

I claim:

1. A superconducting device, comprising:
an elongated coated conductor having a substrate and a quenchable superconducting film, said elongated coated conductor having a width W; and
an external shunt system having bridge contacts electrically connected to said superconducting film and a resistive member thermally insulated from said coated conductor and electrically connected to said bridge contacts, said bridge contacts having a spacing SP along said elongated coated conductor, wherein SP≤8*W, wherein said substrate is an electrically conducting substrate electrically insulated from said superconducting film by means of a dielectric layer, said substrate being equipped with electrical contacts for providing a heating current to said substrate.

2. The superconducting device of claim 1, wherein the superconducting device is designed such that, in case of a quench in said superconducting film, a corresponding normally conducting zone is confined between two neighboring bridge contacts.

3. The superconducting device of claim 1, wherein said coated conductor has an engineering resistivity $\rho_{eng}$ shunting said coated conductor in a quenched state, with $\rho_{eng}$>2.5Ω, wherein $R_{IntShunt}$=$\rho_{eng}$*L/W, with $R_{IntShunt}$: an internal shunt resistance of said coated conductor at a mean operation temperature thereof and in a quenched state, and L: a length of said coated conductor.

4. The superconducting device of claim 1, wherein SP≤1*W.

5. The superconducting device of claim 4, wherein 0.3*W≤SP≤1*W.

6. The superconducting device of claim 1, wherein 1.5*W≤SP≤8*W.

7. The superconducting device of claim 6, wherein 3*W≤SP≤8*W.

8. The superconducting device of claim 1, wherein between each two neighboring bridge contacts, 40*$R_{ExtShunt}$≤$R_{IntShunt}$≤500*$R_{ExtShunt}$,
with $R_{ExtShunt}$ an external shunt resistance provided by said external shunt system at a mean operation temperature thereof in a quenched state and $R_{IntShunt}$ being an internal shunt resistance of said coated conductor at a mean operation temperature thereof in a Quenched state.

9. The superconducting device of claim 8, wherein 50*$R_{ExtShunt}$≤$R_{IntShunt}$≤200*$R_{ExtShunt}$.

10. The superconducting device of claim 1, wherein said superconducting film of said coated conductor comprises YBCO material.

11. The superconducting device of claim 1, wherein said substrate is a steel substrate.

12. The superconducting device of claim 1, wherein said bridge contacts extend over said full width W of said coated conductor.

13. A fault current limiter, comprising the superconducting device of claim 1.

14. The fault current of claim 13, wherein the fault current limiter is of AC type with a primary coil for carrying a current to be limited and a secondary coil coupled to said primary coil via a common magnetic flux, said secondary coil being integrated in the superconducting device.

15. A superconducting device, comprising:
a quenchable coated conductor having a substrate and a superconducting film, wherein said quenchable coated conductor exhibits at least one hot spot forming after a quench event; and an external shunt system having bridge contacts electrically connected to said superconducting film and a resistive member thermally insulated from said coated conductor and electrically connected to said bridge contacts, wherein said bridge contacts have a spacing SP along said quenchable coated conductor which corresponds to a characteristic longitudinal width of the hot spot formed at a minimal level of power dissipation during the quench event, wherein said substrate is an electrically conducting substrate electrically insulated from said superconducting film by means of a dielectric layer, said substrate being equipped with electrical contacts for providing a heating current to said substrate.

16. The superconducting device of claim 15, wherein said coated conductor is elongated and has a width W, wherein $SP \leq 8*W$.

17. A fault current limiter comprising the superconducting device of claim 15.

18. The fault current of claim 17, wherein the fault current limiter is of AC type with a primary coil for carrying a current to be limited and a secondary coil, coupled to said primary coil via a common magnetic flux, said secondary coil being integrated in the superconducting device.

\* \* \* \* \*